(12) United States Patent
Barlian et al.

(10) Patent No.: US 6,753,473 B2
(45) Date of Patent: Jun. 22, 2004

(54) ELECTRICAL DEVICE

(75) Inventors: Reinhold Barlian, Bad Mergentheim (DE); Hans-Jürgen Linström, Weikersheim (DE); Josef Bach, Lauda-Gerlachsheim (DE)

(73) Assignee: Bartec Componenten und Systeme GmbH, Mergentheim (DE)

( * ) Notice: Subject to any disclaimer, the term of this patent is extended or adjusted under 35 U.S.C. 154(b) by 0 days.

(21) Appl. No.: 09/733,347

(22) Filed: Dec. 11, 2000

(65) Prior Publication Data

US 2001/0006111 A1 Jul. 5, 2001

(30) Foreign Application Priority Data

Dec. 9, 1999 (DE) .......................... 199 59 384

(51) Int. Cl.⁷ ................................ H01K 5/00
(52) U.S. Cl. .................. 174/52.1; 174/50; 174/50.5; 361/679

(58) Field of Search ................. 174/52.1, 50, 50.5; 361/679, 724, 726, 730, 732, 747, 752, 758, 759

(56) References Cited

U.S. PATENT DOCUMENTS

| | | | | |
|---|---|---|---|---|
| 3,974,933 A | * | 8/1976 | Toth et al. | 220/3.8 |
| 5,299,094 A | * | 3/1994 | Nishino et al. | 174/255 |
| 5,959,839 A | * | 9/1999 | Gates | 257/719 |
| 6,025,991 A | * | 2/2000 | Saito | 165/185 |

OTHER PUBLICATIONS

Document No. EN50018 Europe.

* cited by examiner

Primary Examiner—Anthony Dinkins
Assistant Examiner—Carmelo Oliva
(74) Attorney, Agent, or Firm—Horst M. Kasper

(57) ABSTRACT

An electrical device with a pressure proof metal protection casing with at least two casing parts and a shape matching profile clamp connecting the casing parts in the region of an ignition punch safe slot against the force of an internal pressure in the casing.

29 Claims, 7 Drawing Sheets

ELECTRICAL DEVICE

BACKGROUND OF THE INVENTION

1. Field of the Invention

The invention relates to an electrical device with a casing of the ignition protection pressure resistant metal protection "d".

2. Brief Description of the Background of the Invention Including Prior Art

Electrical devices of this kind are known from the printed patent document EN 50018.

SUMMARY OF THE INVENTION

1. Purposes of the Invention

It is an object of the invention to achieve a space saving reliable casing slot connection with simple means.

2. Brief Description of the Invention

The present invention furnishes an electrical device with the casing (1,20,44,52) of the ignition protection kind flame proof enclosure "d", with at least two casing parts (2,3,23, 24, 45, 56) with the wall parts (5,6,21, 22, 48, 55) disposed toward each other, a slot (7, 28) safe against ignition punch furnished between the wall parts (5,6,21, 22, 48, 55) and a profile clamp (4,29, 46, 53) connecting the casing part (2,3,23,24, 45, 56) shape matching against the force of an explosion like internal pressure of the casing.

The profile clamp (4,29, 46, 53) can exhibit a cross-section of about C-shape. The profile clamp (4,29, 46, 53) can exhibit a base web (8,30) and two side webs (9,10,31, 32, 47, 54), wherein the one side web (9, 32, 54) corresponds to the one casing part (2,24, 56) and wherein the second side web (10,31, 47) corresponds to the second casing part (3,23, 45).

The side webs (9,10,31, 32, 47, 54) of the profile clamp (4,29, 46, 53) can be disposed at a distance relative to each other and are disposed at one and the same side of the base web (8,30) preferably having a rectangular cross-section under an angle, and preferably essentially are disposed at the right angle relative to the rectangle base web (8,30).

An ignition punch safe supplemental slot (17, 40, 51, 59) can be formed between a stop face (15,38,49,57) of the side webs (9,10,31, 32, 47, 54) of the profile clamp (4,29, 46, 53) and the support face (16,39,50,58) of the casing parts (2,3,23, 24, 45, 56). The stop face (15,38) of the side web (9,10,31, 32) of the profile clamp (4,29) and the support face (16,39), the casing part (2,3,23, 24) as well as the ignition punch safe supplemental slot (17, 40) are disposed in parallel to the ignition punch safe slot (7, 28). The stop face (57) of the side web (54) of the profile clamp (53) and the support face (58) of the casing part (56) as well as the ignition punch safe supplemental slot (59) can be disposed inclined relative to the ignition punch safe slot (7, 28). The ignition punch safe supplemental slot (17, 40, 59) between the stop face (15,38,57) of the side web (9,10,31, 32, 54) and the support face (16,39,58) of the casing part (2,3,23, 24, 56) can be shorter than the ignition punch safe slot (7, 28) between the two casing parts (2,3,23, 24, 45). The length of the ignition punch safe supplemental slot (51) between the stop face (49), the side web (47) and the support face (50) of casing part (45) can be equal to or larger than the ignition punch safe slot (7) between the two casing parts (2, 45).

At least one part of the profile clamp (4,29, 46, 53) is supported in a recess of the casing part (2,23, 24). The face (13,37) of the a base web (8,30) of the profile clamp (4,29, 46, 53) together with an outer side (14,36) of at least one of the casing parts (2,23, 24, 56) can form a substantially common plane. An inner face (11,33) of the base web (8,30) of the profile clamp (4,29, 46, 53) can be disposed toward the casing (1,20,44,52) is disposed parallel to a rest face (12,34) of the casing part (2,3,23, 24, 56). A distance can be formed between the inner face (11,33) of the base web (8,30) of the profile clamp (4,29, 46, 53) and the rest face (12,34) of the casing part (2,23, 24, 56), wherein the distance is preferably less than one mm. An additional wall (25) can be disposed between the two wall parts (23, 24) of the casing (20).

The ignition punch safe slot (28) can be formed between the wall part (21, 22) of the casing (20) and one side face (26,27) of the additional wall (25). One front face (35) of the additional wall (25) can border at the inner face (33) of the profile clamp (29). The ends of two profile clamps (4,29, 46, 53) can abut to each other in a casing corner region such that a planar or nonplanar ignition punch safe profile slot (43,60) is formed.

A profile can be formed at at least one end of the one profile clamp (4,29, 46, 53) and wherein at the one end of a second profile clamp (4,29, 46, 53) in each case a profile is formed out of projections (41) and recesses (42), wherein the projections (41) of the one profile clamp (4,29, 46, 53) engage into the recesses (42) of the other profile clamp (4,29, 46, 53) and wherein the ignition punch safe profile slot (43) exists between the projections (41) and the recesses (42). The projections (41) and the recesses (42) of the profile clamp (4,29, 46, 53) can be formed as teeth or, respectively, tooth gaps and are preferably of triangular shape. The ignition punch safe profile slot (43) can be formed as a 45 degrees mitre joint in a corner region of the profile clamp. The corner region of the profile clamp can be formed polygonal and exhibits at least two ignition punch safe profile slots (43). The profile clamp (4,29, 46, 53) with the base web (8,30) and the side webs (9,10,31, 32, 47, 54) can be produced as a single piece of a uniform material. The profile clamp (4,29, 46, 53) is fixed non-losable at at least one of the casing parts (2,3,23, 24, 45, 56).

Further advantages and essential details of the invention can be gathered from the following description and the drawing, which show by example preferred embodiments in a schematic representation.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWINGS

In the accompanying drawing, in which are shown several of the various possible embodiments of the present invention.

DESCRIPTION OF INVENTION AND PREFERRED EMBODIMENT

Figure 1:
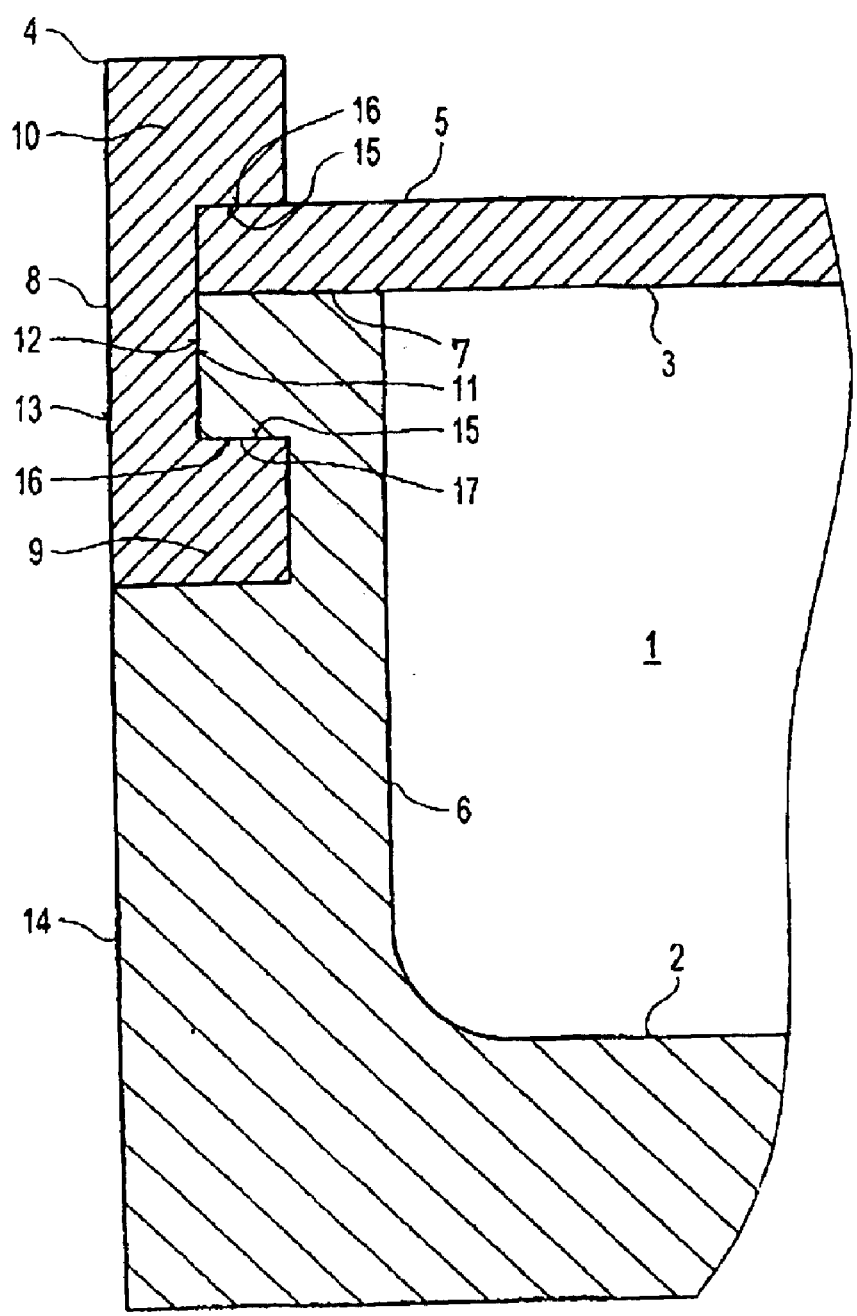
FIG. 1 is a schematic view of a part of a casing according to the invention with a planar upper casing part and a profile clamp with the same side webs in a sectional view.

The casing 1 according to the present invention illustrated in FIG. 1 corresponds to the ignition protection kind pressure resistant metal protection "d" and exhibits a trough shaped casing part 2, a flat cover shaped casing part 3, and a profile clamp 4. The wall part 5 forming the edge region of the casing part 3 rests at the front side of a wall part 6 of the casing part 2. The profile clamp 4 connects the two casing parts 2,3 to each other, and in fact such that the casing parts 2,3 are held solidly together even in case of an explosion occurring in the interior of the casing by an ignitable mixture and wherein an ignition punch safe slot 7 is formed between the wall parts 5,6.

The cross-section of the profile clamp 4 is formed essentially about C-shaped, but with substantially rectangular sections. For this purpose the profile clamp 4 exhibits a base web 8 and two side webs 9,10, which are disposed at a distance from each other and which are disposed at one and the same side of the base web 8 at a right angle relative to the base web 8. The base web 8 and the side webs 9,10 themselves advantageously can be associated with a rectangular cross-section.

According to a preferred embodiment, the wall part 6 of the casing part 2 can exhibit a recess, wherein a part of the base web 8 and the side webs 9 engage shape matchingly into the recess. This engagement can advantageously be constructed such, that an inner face 11 of the base web 8 is disposed parallel to a rest face 12 of the casing part 2 and to a front side 18 of the casing part 3, wherein a distance between the inner face 11 and the rest face 12 or, respectively, the front side 18 can occur, wherein the distance is preferably less than 1 mm. In addition the base web 8 of the profile clamp 4 is disposed so deep in the recess that an outer face 13 of the base web 8 forms a common plane with an outer side 14 of the wall part 6.

Furthermore, it can be advantageously with respect to the safety of the casing 1, to furnish an ignition punch safe additional slot 17 between the stop face 15 of the side webs 9,10 disposed parallel to the ignition flashover safe slot 7 and a support face 16 of the casing parts 2,3. This ignition flashover safe additional slot 17 can preferably be formed shorter as compared with the ignition punch safe slot 7 between the casing parts 2,3.

The casing 2 shown in FIG. 1 represents one side of the electrical protection device of the present invention. A part similar to that shown in FIG. 1, however mirror symmetrical relative to a vertical line in FIG. 1 will complete the electrical protection device cross-section. The casing 2 can be formed as a longitudinal part to be extended at the longitudinal ends with alike parts to form a protective and shielded electrical device. Alternatively, the electrical device can be formed as a tub, wherein the cross-section narrows the open inner space near longitudinal ends and provides a closure such that electrical equipment and cabling can be placed safe and protected.

The cover shaped casing part can have a thickness of from about 0.1 to 0.5 times the thickness of the casing 2. The base web 8 can have a thickness of from about 0.1 to 0.5 times the thickness of the casing 2. The vertical length of the profile clamp 4 as shown in FIG. 1 can be from about 0.1 to 0.5 times the vertical length of the of the wall part 6 shown in FIG. 1.

Figure 2:
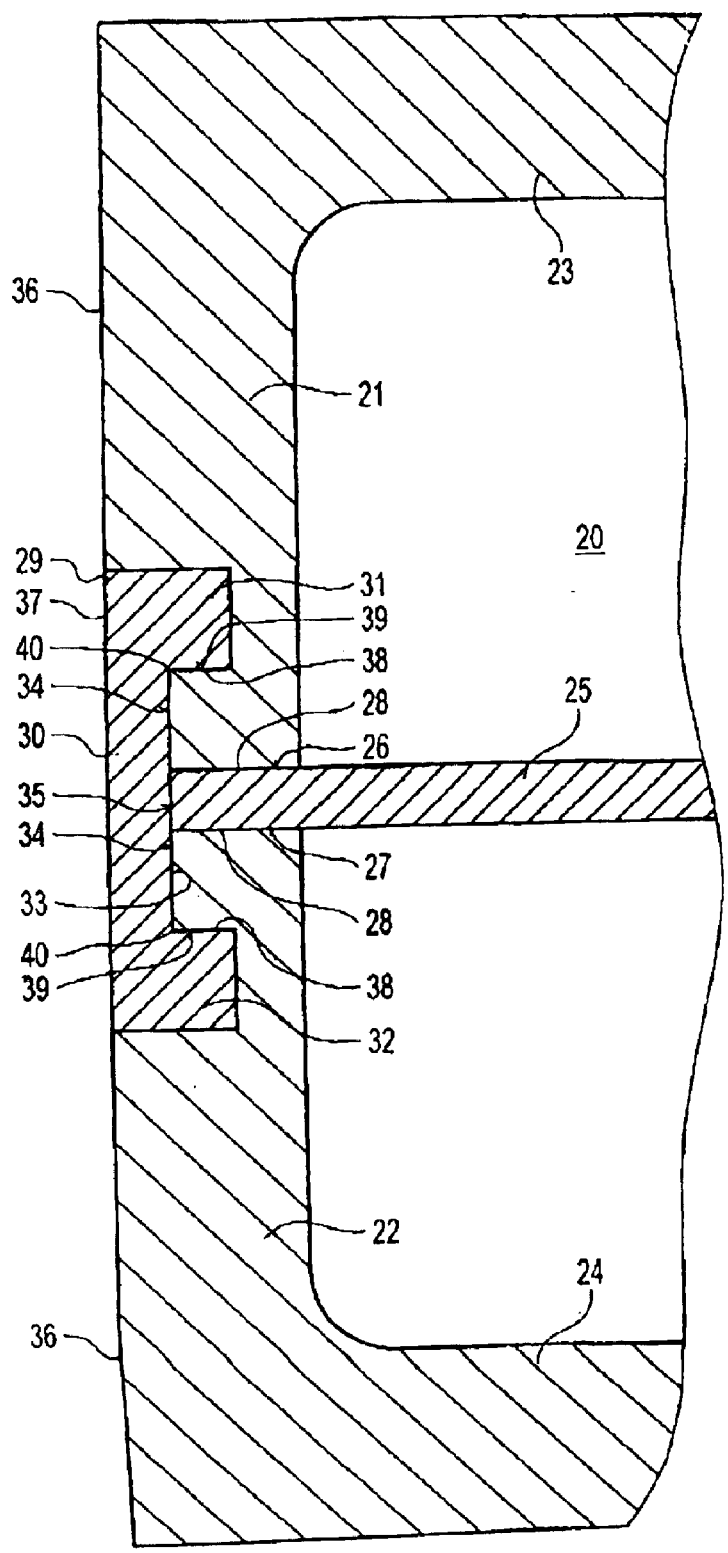
FIG. 2 is a schematic view of a part of the casing according to the present invention with a bonnet shaped upper casing part and a profile clamp according to FIG. 1 in a sectional view.

A supplemental wall 25 dividing the casing 20 is disposed between the wall parts 21, 22 of the tub shaped or, respectively, bonnet shaped casing part 23,24 in the pressure resistant casing 20 or flame proof enclosure illustrated in FIG. 2. The distance between the front sides of the wall parts 21, 22 disposed toward each other is only slightly larger than the thickness of the supplemental wall 25 such that the supplemental wall 25 is held substantially free of play within the distance region. In addition in each case an ignition punch safe slot 28 is formed both between the wall part 21 of the one casing part 23 and the one side face of the supplemental wall 25 as well as between the wall part 22 of the other casing part 24 and the other side face 27 of the supplemental wall 25. The casing part 23,24 are shape matchingly connected by the profile clamp 29 such that also in case of an explosion occurring in the interior of the casing there is assured a firm holding together. The profile clamp 29 is essentially formed of C-shape as was the profile clamp 4 of the embodiment described above and profile clamp 29 has in addition a base web 30 having a rectangular shaped cross-section and two side webs 31, 32 having also rectangular shape, wherein the side webs 31, 32 are disposed at a distance from each other on one and the same side of the base web 30.

Both, the wall part 21 as well as the wall part 22 exhibits a recess, wherein the profile clamp 29 is supported in the recess. Here the inner face 33 of the base web 30 can be disposed without a distance or with a distance, wherein such distance preferably amounts to less than 1 mm, parallel to the rest faces 34 of the casing part 23,24 and parallel to a front face 35 of the supplemental wall 25. The profile clamp 29 is supported in the recesses of the wall parts 21, 22 such that the outer sides 36 of the wall parts 21, 22 and the outer face 37 of the base web 30 form a common plane. In addition in each case an ignition flashover safe additional slot 40 can be formed between the stop faces 38 of the side web 31, 32 and the support faces 39 of the casing parts 23,24. The ignition flashover safe additional slots 40 extend parallel to the ignition flashover safe slots 28 and are formed here shorter then the ignition flashover safe slots 28, but the ignition flashover safe additional slots 40 can also be longer than the ignition flashover safe slots 28.

The casing shown in FIG. 2 is effectively a double casing relative to the casing of FIG. 1 with the supplemental wall 25 separating two spaces of the casing of FIG. 2. The profile clamp 29 according to FIG. 2 holds the casing parts 23, 24 together as shown in FIG. 2, whereas the profile clamp 8 according to FIG. 1 holds the casing part 2 and the casing part 3 of FIG. 1 together.

Figure 3:
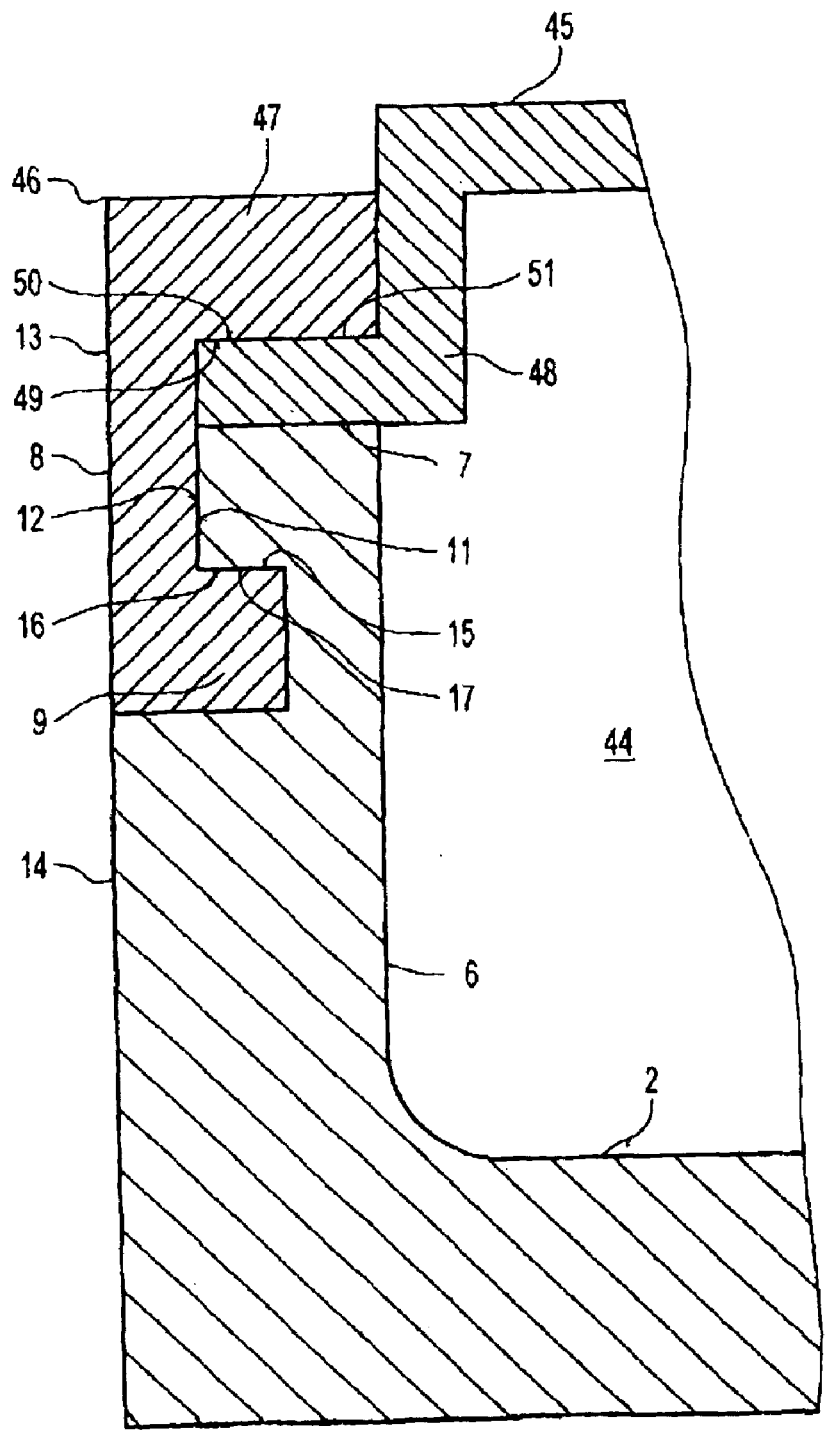
FIG. 3 is a schematic view of a part of the casing according to the present invention similar to that of FIG. 1, however with a step shaped upper casing part and a profile clamp with unequally long side webs in a sectional view.

The casing 44 illustrated in FIG. 3 resembles the embodiment illustrated in FIG. 1. However the edge region of the upper casing part 45 is formed step shaped and the profile clamp 46 exhibits at the base web 8 a short side web 9 and a long side web 47. This side web 47 grips over the wall part 48 of the casing part 45, wherein the casing part 45 rests on the wall part 6 of the lower casing part 2. Here the stop face 49 of the side web 47 corresponds to the support face 50 of the wall part 48, thereby the ignition punch safe additional slot 51 is formed, wherein the ignition punch safe additional slot 51 is of equal length as the ignition punch safe slot 7 between the wall part 48 of the upper casing part 45 and the wall part 6 of the lower casing part 2 according to the present embodiment.

Figure 4:
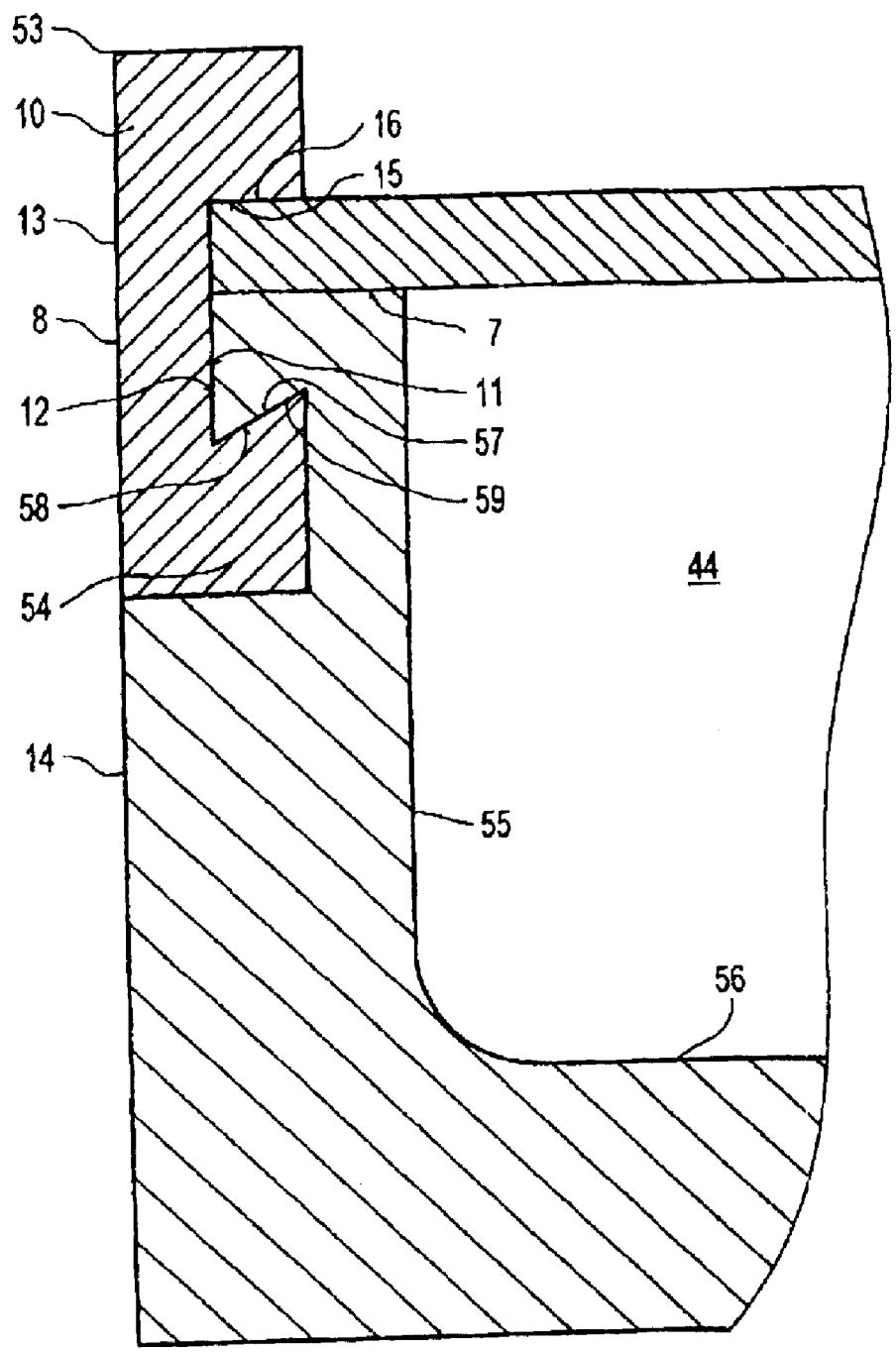
FIG. 4 is a schematic view of a part of a casing according to the present invention similar to FIG. 1 however with the profile clamp partially forming a dovetail shape in a sectional view.

The casing 52 of FIG. 4 again is similar to the embodiment illustrated in FIG. 1. However the profile clamp 53 exhibits a dovetail shaped side web 54, wherein the dovetail shaped side web 54 is supported in a correspondingly dovetail-shaped formed recess of the wall part 55 of the lower casing part 56. Thus the stop face 57 of the side web 54 as well as the support face 58 of the wall part 55 and also the ignition punch safe additional slot 59 are running inclined or, respectively, inclined relative to the ignition punch safe slot 7 between the upper casing part 3 and the lower case in part 56.

The profile clamp 4,29, 46, 53 can consist totally out of one and the same material, that is both the base web 8,30 as well as the in each case associated side webs 9,10,31, 32, 47, 54 are formed as a single piece out of uniform material. The profile clamp 4,29, 46, 53 can at least advantageously be fixed at one of the casing parts 2,3,23,24, 45, 56, for example, by way of threaded screws not illustrated here, in order to secure the profile clamp 4,29, 46, 53 against an unintended disengagement.

Figure 5:
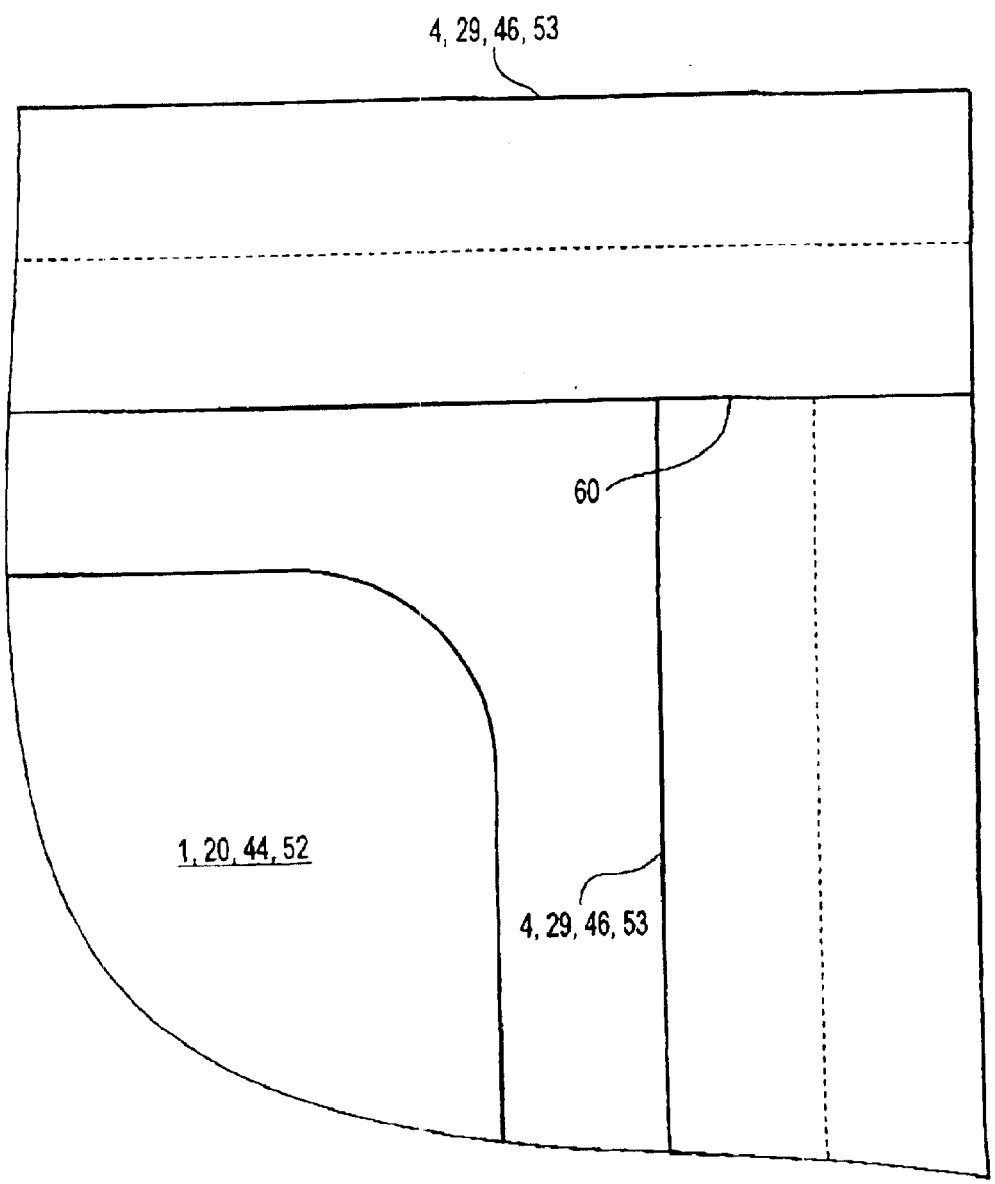
FIG. 5 is a schematic view of a rectangular performed corner region of a casing according to the present invention of profile clamps abutting bluntly onto each other.

The casing corner region illustrated in FIG. 5 is formed rectangular, wherein two ends of the profile clamps 4,29, 46, 53 abut vertically bluntly against each other, and in fact such that the front end of the 45 clamp 4,29, 46, 53, illustrated vertically in the drawing, rests at a side face of the profile clamp 4,29, 46, 53, illustrated horizontally in the drawing. The rest plane is planar such that a planar ignition flashover safe profile slot 60 is formed.

Figure 6:
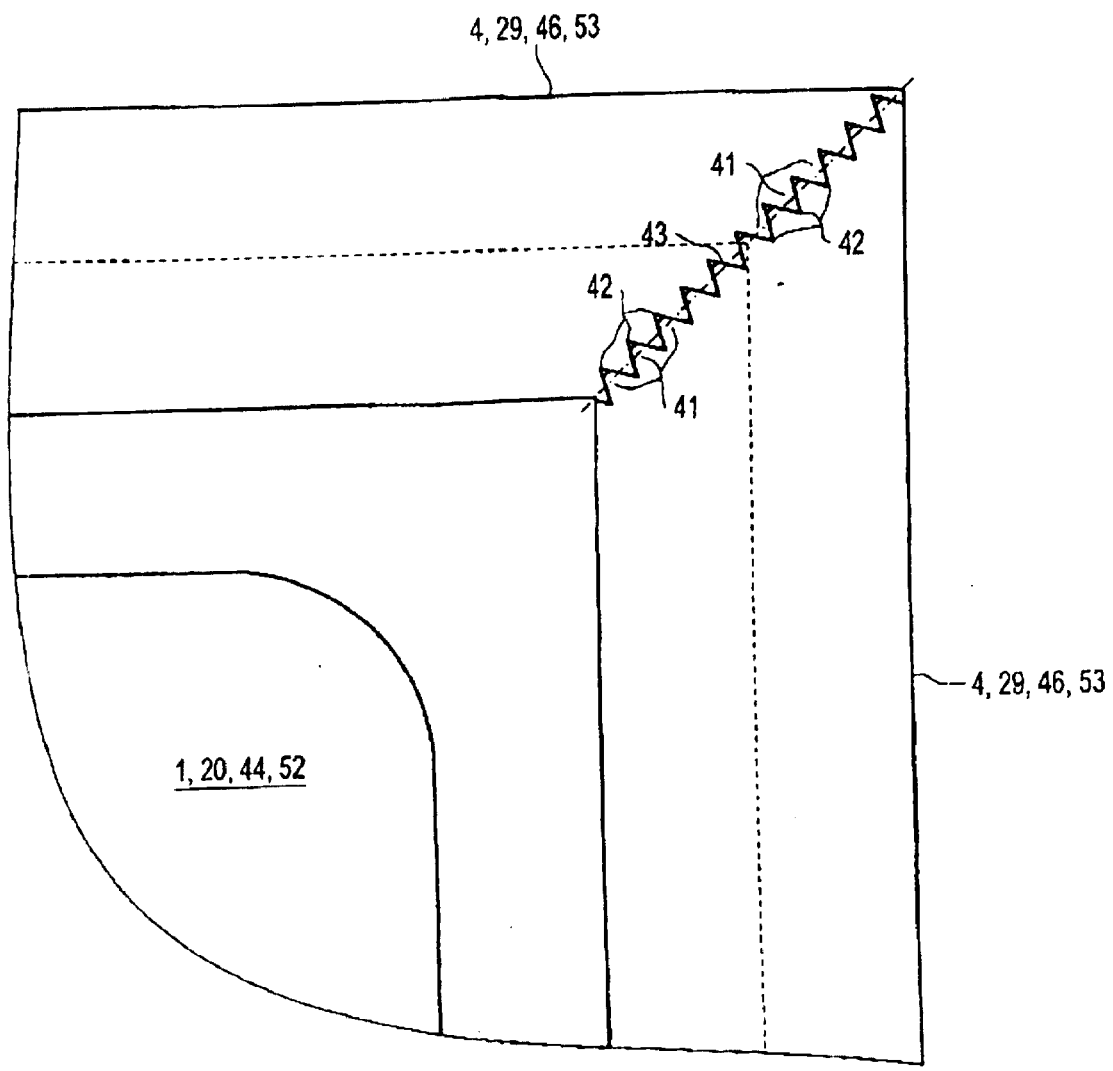
FIG. 6 is a schematic view of a rectangular performed corner region of a casing according to the present invention with profile clamp ends abutting under an angle of 45 degrees.

The corner region of the casing, illustrated in FIG. 6, is also formed rectangular and again here two ends of the profile clamps 4,29, 46, 53 abut vertically on top of each other, however with their front ends running inclined relative to the respective longitudinal direction of the profile clamp. The front ends abutting on each other, each have a profile, wherein the profile is formed of projections 41 and recesses 42, which are preferably formed as triangular shaped teeth with intermediately disposed triangular shaped gaps between teeth. It is within the scope of the present invention to form the projections 41 and the recesses 42, also in a different way and for example to provide the projections 41 and the recesses 42 as rectangular shaped, trapezoidal or saw tooth like teeth and tooth gaps. The projections 41 of the one profile clamp 4,29, 46, 53 engage into the recesses 42 of the other profile clamp 4,29, 46, 53 such that a tooth compound with the ignition punch safe profile slot 43 is formed in a 45 degrees mitre joint.

Figure 7:
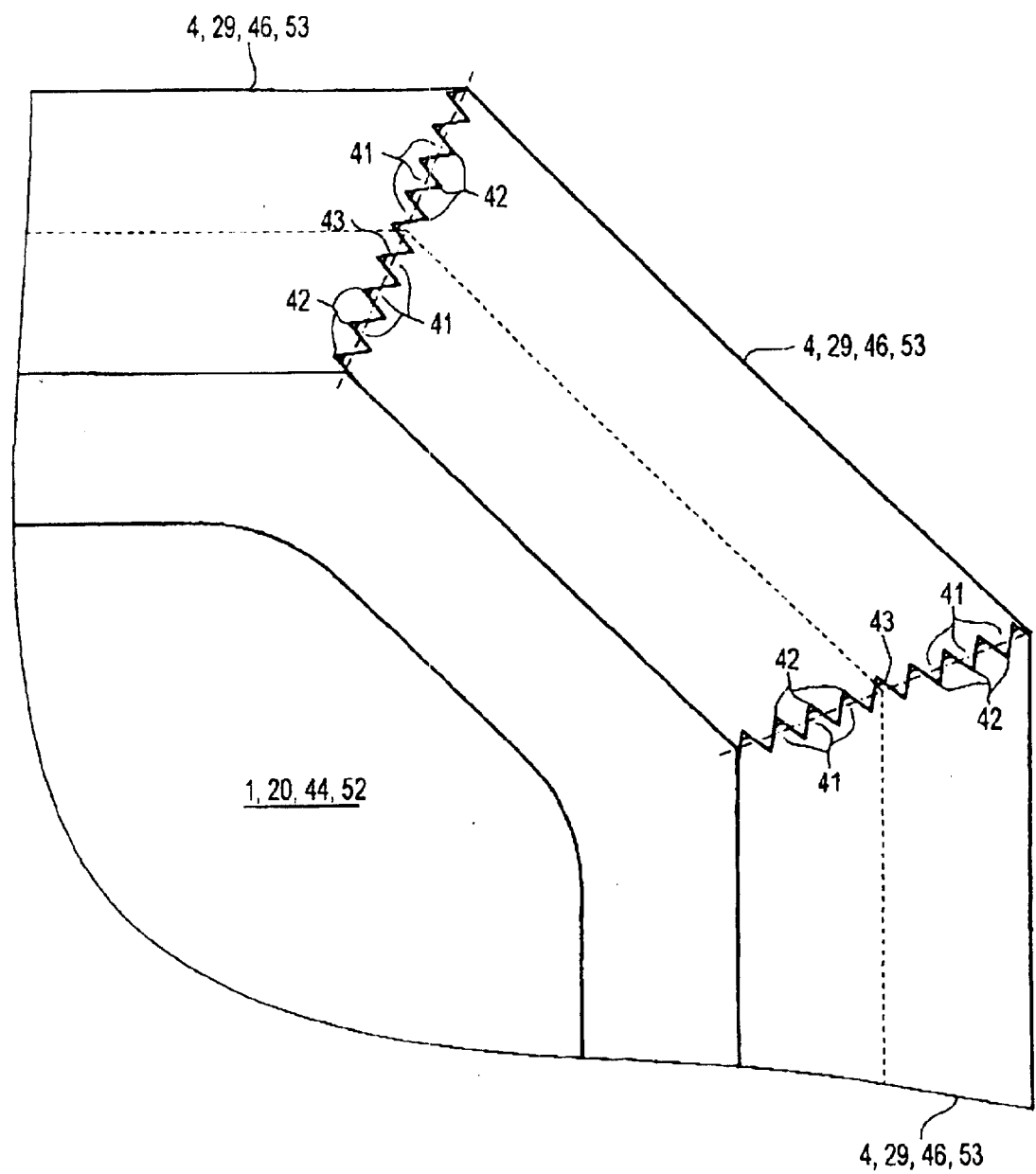
FIG. 7 is a schematic view of a polygon like performed corner region of a casing according to the present Invention with profile clamp ends abutting at a bevel to each other.

The corner region illustrated in FIG. 7 is formed polygon like and has two tooth compounds with engaging projections 41 and recesses 42 as well as two ignition punch safe profile slots 43. The projections 41 and the recesses 42 are formed here as triangular shaped teeth with intermediately disposed triangular shaped gaps as was shown in the embodiment of FIG. 6.

It will be understood that each of the elements described above, or two or more together, may also find a useful application in other types of electrical system configurations and shielding procedures differing from the types described above.

While the invention has been illustrated and described as embodied in the context of an electrical protection device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is:

1. An electrical device with the casing (1,20,44,52) of the ignition protection kind flame proof enclosure, wherein parts, which can ignite an atmosphere capable of explosion, are disposed in the enclosure, wherein the enclosure withstands a pressure generated upon explosion of a mixture capable of explosion in an interior of the enclosure and wherein the enclosure prevents a transfer of the explosion to an atmosphere capable of explosion and surrounding the enclosure, comprising:
   two casing parts (2,3,23,24, 45, 56) having wall parts (5,6,21, 22, 48, 55), wherein the wall parts (5,6,21, 22, 48, 55) are disposed toward each other;
   a profile clamp (4,29, 46, 53) formed shape matching to the casing parts (2,3,23,24, 45, 56) and connecting the casing parts (2,3,23,24, 45, 56) against the force of an explosion like internal pressure of the casing;
   a slot (7, 28) safe against ignition punch, furnished between the wall parts (5,6,21, 22, 48, 55) and terminated by the profile clamp (4,29, 46, 53).

2. The electrical device according to claim 1, wherein the profile clamp (4,29, 46, 53) exhibits a cross-section of about a C-shape and is furnished by a single part structure.

3. The electrical device according to claim 1, wherein the profile clamp (4,29, 46, 53) exhibits a base web (8,30) and two side webs (9,10,31, 32, 47, 54), wherein the one side web (9, 32, 54) structurally matches the one casing part (2,24, 56) and wherein the second side web (10,31, 47) structurally matches the second casing part (3,23, 45).

4. The electrical device according to claim 3, wherein the side webs (9,10,31, 32, 47, 54) of the profile clamp (4,29, 46, 53) disposed at a distance relative to each other are disposed at one and the same side of the base web (8,30) having a rectangular cross-section under an angle, and essentially are disposed at a right angle relative to the rectangle base web (8,30).

5. The electrical device according to claim 3, wherein an ignition punch safe supplemental slot (17, 40, 51, 59) is formed between a stop face (15,38,49,57) of the side webs (9,10,31, 32, 47, 54) of the profile clamp (4,29, 46, 53) and a support face (16,39,50,58) of the casing parts (2,3,23, 24, 45, 56).

6. The electrical device according to claim 5, wherein the stop face (15,38) of the side webs (9,10,31, 32) of the profile clamp (4,29), the support face (16,39), the casing parts (2,3,23, 24) and the ignition punch safe supplemental slot (17, 40) are disposed parallel to the ignition punch safe slot (7, 28).

7. The electric device according to claim 5, wherein the stop face (57) of the side web (54) of the profile clamp (53) and the support face (58) of the casing part (56) as well as the ignition punch safe supplemental slot (59) are disposed inclined relative to the ignition punch safe slot (7, 28).

8. The electrical device according to claim 5 further comprising:

the ignition punch safe supplemental slot (17, 40, 59) disposed between the stop face (15,38,57) of the side web (9,10,31, 32, 54) and the support face (16,39,58) of the casing part (2,3,23, 24, 56) and being shorter than the ignition punch safe slot (7, 28) between the two casing parts (2,3,23, 24, 45).

9. The electrical device according to claim 8, wherein the length of the ignition punch safe supplemental slot (51) between the stop face (49), the side web (47) and the support face (50) of casing part (45) is equal to or larger than the ignition punch safe slot (7) between the two casing parts (2,45).

10. The electrical device according to claim 3, wherein the profile clamp (4,29, 46, 53) with the base web (8,30) and the side webs (9,10,31, 32, 47, 54) are produced as a single piece of a uniform material.

11. The electrical device according to claim 1, wherein at least one part of the profile clamp (4,29, 46, 53) is supported in a recess of the casing part (2,23, 24) and matches the shape of the recess of the casing part (2,23,24).

12. The electrical device according to claim 1, wherein an inner face (11,33) of a base web (8,30) of the profile clamp (4,29, 46, 53) disposed toward the casing (1,20,44,52) is disposed parallel to a rest face (12,34) of the casing part (2,3,23, 24, 56).

13. The electrical device according to claim 1, wherein a distance is formed between an inner face (11,33) of a base web (8,30) of the profile clamp (4,29, 46, 53) and a rest face (12,34) of the casing parts (2,23, 24, 56), wherein the distance is less than one mm.

14. The electrical device according to claim 1, wherein an ignition punch safe profile slot (43) is formed as a 45 degrees mitre joint in a corner region of the profile clamp.

15. The electrical device according to claim 1, wherein the profile clamp (4,29, 46, 53) is fixed non-losable at least one of the casing parts (2,3,23, 24, 45, 56) and is formed as a single integral part.

16. The electrical device according to claim 1, wherein the profile clamp (4,29, 46, 53) exhibits a cross-section of about an undivided C-shape and wherein the profile clamp (4,29, 46, 53) is a single integral structure.

17. The electrical device according to claim 1, wherein the profile clamp (4,29, 46, 53) is engageable and disengageable relative to the two casing parts (2,3,23,24, 45, 56) having wall parts (5,6,21, 22, 48, 55) in a direction perpendicular to a C-shaped cross-section of the profile clamp (4,29, 46, 53).

18. An electrical device with the casing (1,20,44,52) of the ignition protection kind flame proof enclosure, wherein parts, which can ignite an atmosphere capable of explosion, are disposed in the enclosure, wherein the enclosure withstands a pressure generated upon explosion of a mixture capable of explosion in an interior of the enclosure and wherein the enclosure prevents a transfer of the explosion to an atmosphere capable of explosion and surrounding the enclosure, comprising:

two casing parts (2,3,23,24, 45, 56) having wall parts (5,6,21, 22, 48, 55), wherein the wall parts (5,6,21, 22, 48, 55) are disposed toward each other;

a profile clamp (4,29, 46, 53) formed shape matching to the casing parts (2,3,23,24, 45, 56) and connecting the casing parts (2,3,23,24, 45, 56) against the force of an explosion like internal pressure of the casing;

a slot (7, 28) safe against ignition punch furnished between the wall parts (5,6,21, 22, 48, 55) and the profile clamp (4,29, 46, 53);

wherein a face (13,37) of a base web (8,30) of the profile clamp (4,29, 46, 53) together with an outer side (14,36) of at least one of the casing parts (2,23, 24, 56) forms a substantially common plane.

19. An electrical device with the casing (1,20,44,52) of the ignition protection kind flame proof enclosure, wherein parts, which can ignite an atmosphere capable of explosion, are disposed in the enclosure, wherein the enclosure withstands a pressure generated upon explosion of a mixture capable of explosion in an interior of the enclosure and wherein the enclosure prevents a transfer of the explosion to an atmosphere capable of explosion and surrounding the enclosure, comprising:

two casing parts (2,3,23,24, 45, 56) having wall parts (5,6,21, 22, 48, 55), wherein the wall parts (5,6,21, 22, 48, 55) are disposed toward each other;

a profile clamp (4,29, 46, 53) formed shape matching to the casing parts (2,3,23,24, 45, 56) and connecting the casing parts (2,3,23,24, 45, 56) against the force of an explosion like internal pressure of the casing;

a slot (7, 28) safe against ignition punch furnished between the wall parts (5,6,21, 22, 48, 55) and the profile clamp (4,29, 46, 53);

an additional wall (25) disposed between the two wall parts (23, 24) of the casing (20).

20. The electrical device according to claim 19 further comprising:

the ignition punch safe slot (28) formed between the wall part (21, 22) of the casing (20) and one side face (26,27) of the additional wall (25).

21. The electrical device according to claim 19, wherein a front face (35) of the additional wall (25) borders at an inner face (33) of the profile clamp (29).

22. An electrical device with the casing (1,20,44,52) of the ignition protection kind flame proof enclosure, wherein parts, which can ignite an atmosphere capable of explosion, are disposed in the enclosure, wherein the enclosure withstands a pressure generated upon explosion of a mixture capable of explosion in an interior of the enclosure and wherein the enclosure prevents a transfer of the explosion to an atmosphere capable of explosion and surrounding the enclosure, comprising:

two casing parts (2,3,23,24, 45, 56) having wall parts (5,6,21, 22, 48, 55), wherein the wall parts (5,6,21, 22, 48, 55) disposed toward each other;

a profile clamp (4,29, 46, 53) formed shape matching to the casing parts (2,3,23,24, 45, 56) and connecting the casing parts (2,3,23,24, 45, 56) against the force of an explosion like internal pressure of the casing;

a slot (7, 28) safe against ignition punch furnished between the wall parts (5,6,21, 22, 48, 55) and the profile clamp (4,29, 46, 53);

wherein ends of two profile clamps (4,29, 46, 53) abut to each other in a casing corner region such that a planar or nonplanar ignition punch safe profile slot (43,60) is formed.

23. An electrical device with the casing (1,20,44,52) of the ignition protection kind flame proof enclosure, wherein parts, which can ignite an atmosphere capable of explosion, are disposed in the enclosure, wherein the enclosure withstands a pressure generated upon explosion of a mixture capable of explosion in an interior of the enclosure and wherein the enclosure prevents a transfer of the explosion to an atmosphere capable of explosion and surrounding the enclosure, comprising:

two casing parts (2,3,23,24, 45, 56) having wall parts (5,6,21, 22, 48, 55), wherein the wall parts (5,6,21, 22, 48, 55) are disposed toward each other;

a profile clamp (4,29, 46, 53) formed shape matching to the casing parts (2,3,23,24, 45, 56) and connecting the casing parts (2,3,23,24, 45, 56) against the force of an explosion like internal pressure of the casing;

a slot (7, 28) safe against ignition punch furnished between the wall parts (5,6,21, 22, 48, 55) and the profile clamp (4,29, 46, 53);

wherein a profile is formed at least one end of the profile clamp (4,29, 46, 53) and wherein at an end of a second profile clamp (4,29, 46, 53), in each case a profile is formed out of projections (41) and recesses (42), wherein the projections (41) of the one profile clamp (4,29, 46, 53) engage into the recesses (42) of the other profile clamp (4,29, 46, 53) and wherein an ignition punch safe profile slot (43) is formed between the projections (41) and the recesses (42).

24. The electrical device according to claim 23, wherein the projections (41) and the recesses (42) of the profile clamp (4,29, 46, 53) are formed as teeth or, respectively, tooth gaps and are of triangular shape.

25. An electrical device with the casing (1,20,44,52) of the ignition protection kind flame proof enclosure, wherein parts, which can ignite an atmosphere capable of explosion, are disposed in the enclosure, wherein the enclosure withstands a pressure generated upon explosion of a mixture capable of explosion in an interior of the enclosure and wherein the enclosure prevents a transfer of the explosion to an atmosphere capable of explosion and surrounding the enclosure, comprising:

two casing parts (2,3,23,24, 45, 56) having wall parts (5,6,21, 22, 48, 55), wherein the wall parts (5,6,21, 22, 48, 55) are disposed toward each other;

a profile clamp (4,29, 46, 53) formed shape matching to the casing parts (2,3,23,24, 45, 56) and connecting the casing parts (2,3,23,24, 45, 56) against the force of an explosion like internal pressure of the casing;

a slot (7, 28) safe against ignition punch furnished between the wall parts (5,6,21, 22, 48, 55) and the profile clamp (4,29, 46, 53);

wherein a corner region of the profile clamp is formed polygonal and exhibits at least two ignition punch safe profile slots (43).

26. An electrical device with the casing (1,20,44,52) of the ignition protection kind flame proof enclosure, comprising:

two casing parts (2,3,23,24, 45, 56) having wall parts (5,6,21, 22, 48, 55), wherein the wall parts (5,6,21, 22, 48, 55) are disposed toward each other;

a slot (7, 28) safe against ignition punch furnished between the wall parts (5,6,21, 22, 48, 55);

a profile clamp (4,29, 46, 53) formed shape matching to the casing parts (2,3,23,24, 45, 56) and connecting the casing parts (2,3,23,24, 45, 56) against the force of an explosion like internal pressure of the casing, wherein the profile clamp (4,29, 46, 53) exhibits a base web (8,30) and two side webs (9,10,31, 32, 47, 54)atone and the same side of the profile clamp (4,29, 46, 53); and an ignition punch safe supplemental slot (17, 40, 51, 59) formed between a stop face (15,38,49,57) of the side webs (9,10,31, 32, 47, 54) of the profile clamp (4,29, 46, 53) and a support face (16,39,50,58) of the casing parts (2,3,23, 24, 45, 56).

27. The electrical device according to claim 26, wherein the base web (8,30) is of rectangular shape, and wherein the side webs (9,10,31, 32, 47, 54) of the profile clamp (4,29, 46, 53) are disposed angle forming relative to the base web (8,30), and essentially are disposed at a right angle relative to the rectangular base web (8,30).

28. The electrical device according to claim 26, wherein at least one part of the profile clamp (4,29, 46, 53) is supported in a recess of the casing part (2,23, 24).

29. An electrical device with the casing (1,20,44,52) of the ignition protection kind flame proof enclosure comprising:

two casing parts (2,3,23,24, 45, 56) having wall parts (5,6,21, 22, 48, 55), wherein the wall parts (5,6,21, 22, 48, 55) disposed toward each other;

a profile clamp (4,29, 46, 53) formed shape matching to the casing parts (2,3,23,24, 45, 56) and connecting the casing parts (2,3,23,24, 45, 56) against the force of an explosion like internal pressure of the casing;

a slot (7, 28) safe against ignition punch furnished between the wall parts (5,6,21, 22, 48, 55) and the profile clamp (4,29, 46, 53);

wherein ends of two profile clamps (4,29, 46, 53) abut to each other in a casing corner region such that a planar or nonplanar ignition punch safe profile slot (43,60) is formed.

* * * * *